(12) United States Patent
Culca

(10) Patent No.: US 6,760,848 B1
(45) Date of Patent: Jul. 6, 2004

(54) EXTERNALLY SUPPLIED INTERFACE ADAPTER

(75) Inventor: Horea-Stefan Culca, Siegburg (DE)

(73) Assignee: Moeller GmbH, Bonn (DE)

( * ) Notice: Subject to any disclaimer, the term of this patent is extended or adjusted under 35 U.S.C. 154(b) by 0 days.

(21) Appl. No.: 09/646,662

(22) PCT Filed: Mar. 20, 1999

(86) PCT No.: PCT/DE99/00802

§ 371 (c)(1),
(2), (4) Date: Sep. 20, 2000

(87) PCT Pub. No.: WO99/49577

PCT Pub. Date: Sep. 30, 1999

(30) Foreign Application Priority Data

Mar. 20, 1998 (DE) ......................... 198 12 422
Apr. 20, 1998 (DE) ......................... 198 17 441

(51) Int. Cl.⁷ ................................ G06F 1/26
(52) U.S. Cl. ..................... 713/300; 710/313
(58) Field of Search ............... 713/300, 320, 713/330, 340; 710/305, 306, 313

(56) References Cited

U.S. PATENT DOCUMENTS

| 4,788,458 | A | | 11/1988 | Kinoshita et al. | |
|---|---|---|---|---|---|
| 4,852,041 | A | * | 7/1989 | Nakano | 703/25 |
| 4,860,311 | A | | 8/1989 | Storberg | |
| 4,884,287 | A | * | 11/1989 | Jones et al. | 375/377 |
| 5,119,482 | A | * | 6/1992 | Lloyd | 710/307 |
| 5,126,601 | A | | 6/1992 | Murphy | |
| 5,402,015 | A | | 3/1995 | Hammermann | |
| 5,555,421 | A | | 9/1996 | Enzinna | |
| 5,664,204 | A | * | 9/1997 | Wang | 713/300 |

FOREIGN PATENT DOCUMENTS

| DE | 218 237 | 1/1985 |
|---|---|---|
| DE | 3718001 | 12/1988 |
| DE | 43 30 939 | 3/1995 |
| DE | 41 35 471 | 4/1995 |
| DE | 44 03 730 | 8/1995 |
| DE | 44 22 465 | 1/1996 |
| DE | 195 14 888 | 10/1996 |
| DE | 196 20 820 | 11/1996 |
| DE | 296 06 029 | 6/1997 |
| EP | 0 432 280 | 6/1991 |
| EP | 0 542 657 | 11/1991 |
| EP | 0 759 658 | 2/1997 |
| FR | 2 743 959 | 7/1997 |

OTHER PUBLICATIONS

089 MAC–nach—VGA–Monitor Adapter, Elektor, 7–8/97, p. 93.
U. Schulze: "Universal Serial Bus: Neue Universalschnittstelle fur den PC", Electronik 3/97, pp 28, 29.
"Goedkope Galvanische Scheider Voor RS232", Elektuur, Jul. 1997, pp. 89.

* cited by examiner

Primary Examiner—Dennis M. Butler
(74) Attorney, Agent, or Firm—Kenyon & Kenyon

(57) ABSTRACT

A coupling piece for carrying out digital transmissions between an electrical interface of a first device and an electrical interface of a second device. The devices each use different voltage levels for distinguishing between the two logical states "high" and "low". An internal circuit is provided for converting the voltage levels of the first device to the voltage levels of the second device, which correspond to the state. The higher voltage level is conveyed to this internal circuit by one of the two devices so that the low level can be converted to the higher level. The internal circuit carries out the conversions using a switching process.

15 Claims, 3 Drawing Sheets

EXTERNALLY SUPPLIED INTERFACE ADAPTER

FIELD OF THE INVENTION

The present invention relates to a converter for digital data transmission between an electrical interface of a first device and an electrical interface of a second device, the devices each using different voltage levels to distinguish the two logical states "high" and "low."

RELATED TECHNOLOGY

When two electronic devices communicate with one another by data transmission, they must speak the same language. In the case of direct transmission of digital data, this means that the "high" and "low" logical states of the two devices must be represented by the same voltage levels.

The article "Goedkope galvanische scheider voor RS232" [Economical galvanic separators for RS-232], ELEKTUUR, July 1997 (1997-07), page 89, XP002102753 discloses a generic converter for digital data transmission for the RS-232 standard. This converter contains a specific embodiment of a galvanic separator in the context of an RS-232 interface. With this embodiment, switching members for generating the signals being transmitted are powered by a voltage that must first be generated by additional circuit elements. Furthermore, an additional voltage supply for the input-side circuit elements of the switching members is necessary.

Two principal standards are used in digital data transmission. The one standard is RS-232, which characterizes the "high" state with pulses having a voltage of approximately −12 volts and the "low" state with pulses having a voltage of approximately +12 volts. Serial interfaces of this kind are preferably used in computing systems such as personal computers (PCs). Many computer-controllable electronic devices, for example control units for motors, switching devices, or stored-program control systems, generate and use TTL standard pulses for communication, with signal strengths of approximately 0 volts for the one state and approximately +5 volts for the other state.

For communication between two electronic devices that work with different voltage levels, the signals must be transformed. In the case of the transformation of TTL standard signals, for example, the positive signals must be converted to −12 volts. This amplification of the signals is technically complex in that external voltage sources are necessary for the purpose. Lowering the signal strength in the case of the RS-232 and TTL standards can occur, however, by simply blocking the voltage with a diode or by transforming the voltage down.

Even if amplification of the signals presents no fundamental problems, for cost reasons and in order to save space it is advantageous specifically with small devices if voltage converters of this kind can be dispensed with, especially when communication with other devices during operation plays a subordinate role. Externally powered interface adapters, which have a plug connector whose housing accommodates a converter circuit with amplifiers, are known for such small devices. This circuit is supplied externally with a higher voltage. Because of the amplifier circuit, interface adapters of this kind are comparatively complex and result in additional cost pressure on electronic devices that are designed for inexpensive mass production.

SUMMARY OF THE INVENTION

It is an object of the present invention to create an interface adapter that can be manufactured economically with little technical outlay.

The present invention provides converter for digital data transmission between an electrical interface of a first device and an electrical interface, configured as an RS-232 interface, of a second device, the devices each using different voltage levels to distinguish the two logical states "high" and "low." The converter includes an internal circuit with which the voltage levels of the first device can be converted to the voltage levels of the second device that correspond to the state, the higher voltage level being conveyable from one of the two devices to the internal circuit in order to convert the lower voltage level to the higher. The internal circuit (23) has conveyed to it, by programming of the second device, a voltage level of +12 volts via the Request To Send output of the RS-232 interface, and a voltage level of −12 volts via the Data Terminal Ready output of the RS-232 interface. The internal circuit (23) has a switching member (13a, 13b) which is independent of the supply voltage, which is controllable by the state of the data line (11) of the first device and which, depending on the logical state of the data line (11), switches one of the two lines, "Request to Send (14) or "Data Terminal Ready" (17), delivered from the second device, through to the data input (15) of the RS-232 interface, of the second device.

The converter according to the present invention creates a simply designed and therefore economical possibility for connecting one electrical interface, e.g. the serial interface of a microcomputer, to the electrical interface of a device that is to be controlled, with simultaneous conversion of the signal levels that serve to differentiate the "high" and "low" logical states. Because the higher voltage level is delivered from one of the two devices, namely from the device that has an "on-board" RS-232 interface, in particular from a PC, an external power supply can be completely dispensed with. According to the present invention, one of the two devices itself makes the necessary voltage level available to the converter. The converter is characterized by its simple components and is particularly robust and reliable, since it combines the functions necessary for the transfer of data between mechanical interfaces that use different languages.

In a particularly advantageous embodiment, the converter (interface adapter) can be integrated into a plug connector that is located on the data transfer line connecting the two devices, but it can also be housed in one of the devices itself. Because of its inexpensive design, it contributes to the simplification of the devices and thus to a decrease in price.

It is particularly advantageous if the internal circuit brings about conversion of the lower level to the higher level by way of a simple switchover operation initiated by the lower-level signal. As a result of the switchover operation, the higher voltage level delivered to the adapter from a device is placed on the data line. According to the present invention, the complex amplification process is replaced by a simple switching operation, which contributes to a further simplification of the interface adapter in that the positive and negative supply voltages become superfluous. The switching operation is performed by way of a switching member that is controllable via the state of the data line of the first device and that, depending on the logical state of the data line, switches one of the two lines conveyed from the second device through to the data input of the second device.

In an advantageous embodiment, the internal circuit converts signals of the TTL standard, of 0 volts and +5 volts respectively, into signals of the RS-232 standard. Such a conversion is often necessary when a PC fitted with an RS-232 interface is communicating with an external device. Since the RS-232 interface has not only the data lines but also other lines, for example the Request To Send (RTS) and Data Terminal Ready (DTR) lines, it is advantageous to use these lines that are already present to convey to the interface adapter the voltage levels of, in particular +/−12 volts. These lines that are not needed for communication with the TTL interface can be switched, without great outlay and by way of a program running on the computer, to the +/−12 volt voltages generally made available by the computer. In this case the switching member simply switches the corresponding voltage through from the RTS or DTR line onto the data transfer line.

In a particularly simple embodiment, the switching member is a switch having two inputs and one output, the inputs being connected to the lines of the RS-232 interface at +/−12 volts and the output being connected to the input data transfer line, and the capability existing of switching back and forth between the two outputs.

In particularly advantageous fashion, the adapter according to the present invention is used for external programming of stored-program control systems with an integrated calculation unit (microcontroller), a display, and a control unit, the control system additionally having a mechanical interface. Since these control systems offer many utilization capabilities even without external programming, the electronics for signal conversion inside the control system can be replaced by the adapter. This makes the control system less expensive, more compact, and more reliable. The user is spared the cost of the amplifier circuit in the control system, and needs to acquire an adapter only when he or she wishes to perform external programming.

Advantageously, galvanic separation of the two devices is integrated into the adapter, so that the corresponding components in the devices can be dispensed with. For that purpose, the internal circuit has a coupling member for galvanic separation. Simple and economical optical couplers, which are available on the market in any desired variant, are suitable as coupling members. Optical couplers of this kind are also suitable for converting the +12 volt signals to the TTL level of +5 volts. Conversion in this direction is advantageously also brought about by the internal circuit. For converting the −12 volt signal to the TTL level of 0 volts, the internal circuit is advantageously equipped with a blocking element, for example in the form of a simple diode.

In a particularly simple embodiment, the internal circuit is accommodated in a housing injection-molded from plastic, which can be placed as a plug connector directly onto the mechanical interface of one of the two devices. The distance to the other interface is bridged using a cable for data transfer.

BRIEF DESCRIPTION OF THE DRAWINGS

An exemplary embodiment of the adapter according to the present invention will be described in more detail below and is depicted in the drawings, in which:

FIG. 1 depicts a stored-program control system having a housing 1 and having a series of voltage inputs 2 and signal outputs 3. The control system, under the control of a switching program, switches the current flow between inputs 2 and outputs 3. The program can be entered into the calculating unit accommodated in housing 1 on the one hand by way of control keys 4 and multifunction key 5, the inputs and program execution being observable on display 6. During programming and operation of the device, a menu-driven user interface is displayed on display 6.

On the other hand, it is possible to program the control system from an external computer 7. For that purpose, computer 7 and the control system are connected via a data line 8 that is connected at the computer end to an RS-232 interface (not depicted) on the back side of the computer, and at the control system end into an interface 9. An externally powered interface adapter 10, which is configured as a plug connector having a housing 10a and a standardized plug head, is placed onto interface 9 of the control system.

Figure 1:
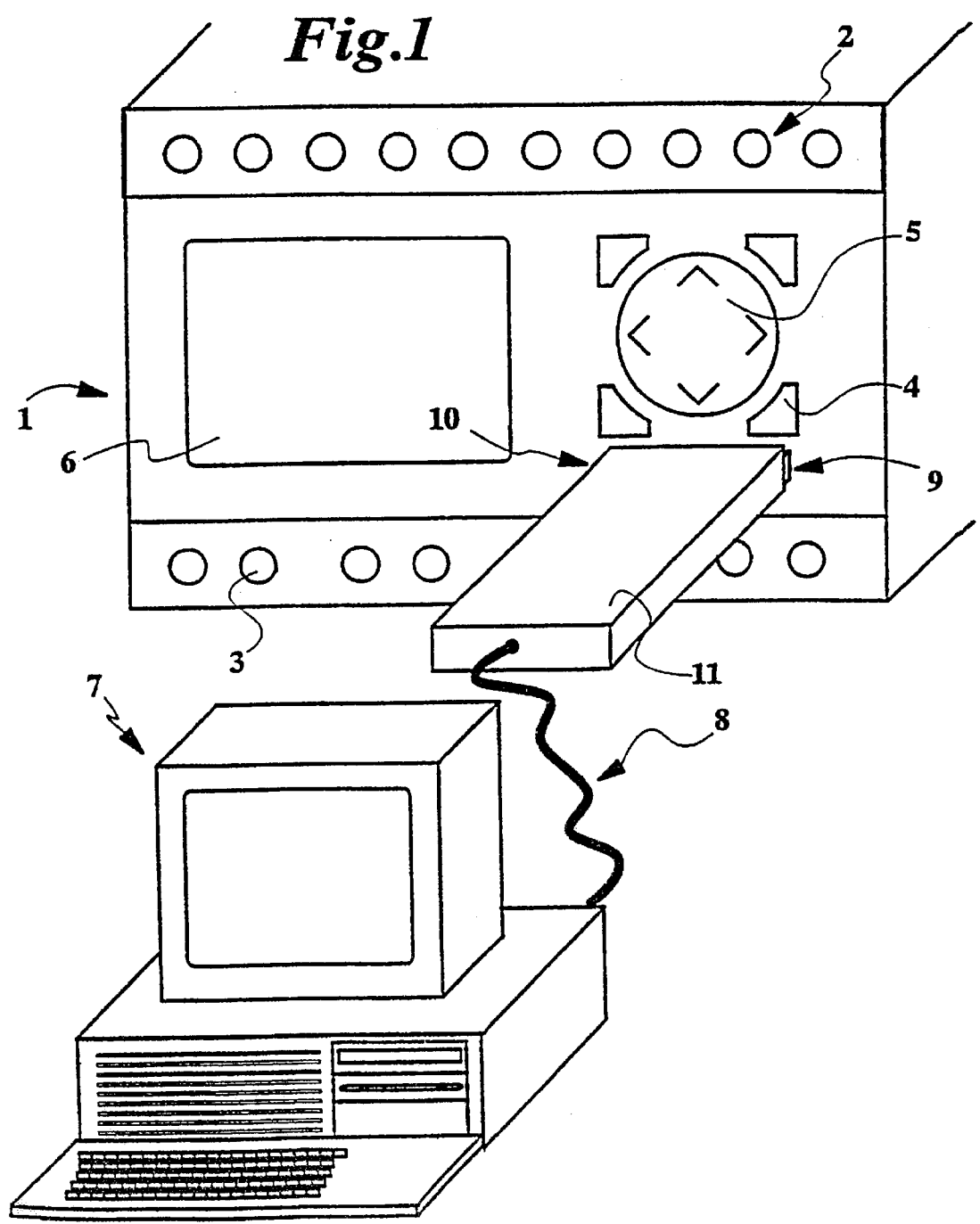
FIG. 1 shows a stored-program control system with an interface adapter and external computer.
Figure 2A:
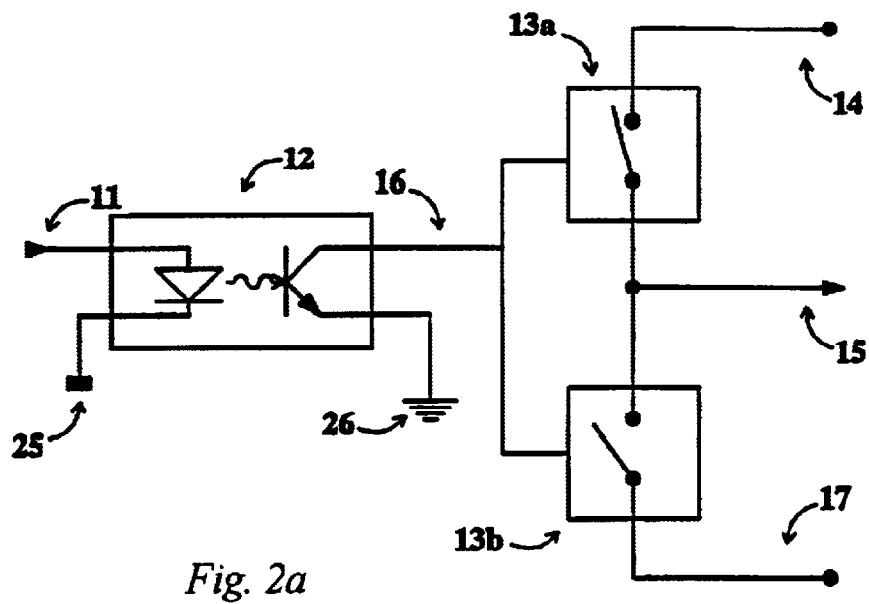
FIG. 2a shows a circuit diagram of the externally powered interface adapter.

FIG. 2a shows internal circuit 23 of interface adapter 10. The connectors to the computer's interface are depicted on the right side of FIG. 2a, and the connectors to interface 9 of the control system on the left side. On the control-system side, a transmit line (TxD) 11 for a 5 volt TTL signal leads into an optical coupler 12. The 5 volt signal on line 11 leads to a first signal state, galvanically separated therefrom, on a line 16 and to two switches 13a and 13b to be controlled by the latter. In the state depicted, switch 13a is closed and connects two lines 14 and 15 coming from the computer's RS-232 to one another. The computer is programmed in such a way that a voltage of 12 volts is present on line 14 (RTS line). As a result of the connection, this voltage is applied to line 15, the RxD input of the interface. Switch 13a remains closed for the duration of the first signal state on line 16, so that a 12 volt pulse of corresponding length is present on line 15.

When the voltage on transmission line 11 rises to 5 volts, which corresponds to a "high" logical state in the TTL standard, a second signal state is generated on line 16 that opens switch 13a and closes switch 13b. Switch 13b then creates a connection between lines 15 and 17 of the RS-232, the computer being programmed so that a constant voltage of −12 volts is present on line 17 (the DTR output). For the duration of the "low" level on line 11 of interface 9, the −12 volt signal is present on the TxD input of the RS-232. In the manner set forth, a TTL pulse sequence of the control system is converted into a corresponding RS-232 pulse sequence for the computer.

Figure 2B:
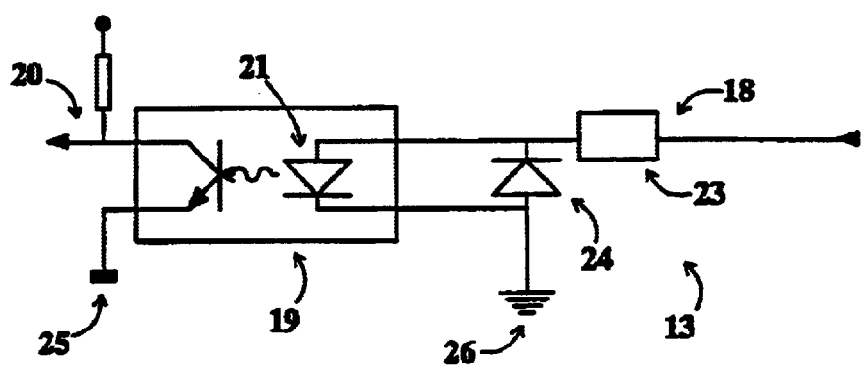
FIG. 2b shows another circuit diagram of the externally powered interface adapter.

The adapter also has a circuit for converting signals from computer to control system which is shown in FIG. 2b. In this context, the signal present on line 18 (the RxD line of the RS-232) can be conveyed directly to an optical coupler 19. +12 volt signals from the computer are converted by optical coupler 19 to 0 volts on RxD line 20 of the control system. A −12 volt signal on line 18 is blocked by diode 21, so that approximately +5 volts, for the TTL "high" state, is present on line 20. A resistor 23 is introduced into line 18 for power limitation. A diode 24 serves to protect the optical coupler diode in the event of a negative signal.

Because of their galvanic separation, a differentiation must be made between ground 25 of the device and ground 26 of the PC.

Figure 3:
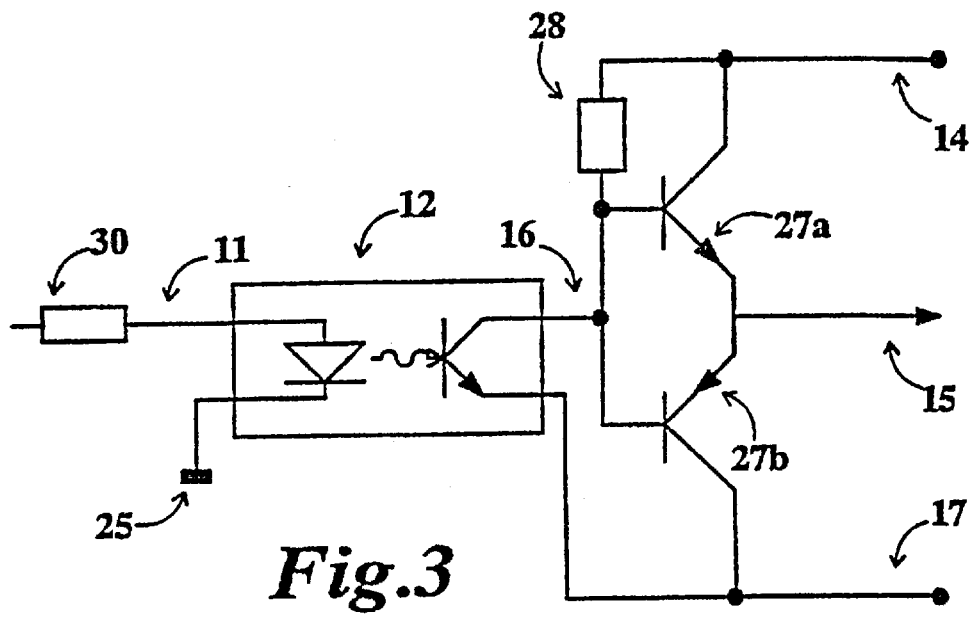
FIG. 3 shows a circuit for low transmission speeds.

One embodiment of circuit 12, 13a, 13b is realized in particularly simple and economical fashion using transistors. FIG. 3 shows a circuit with galvanic separation. Circuit elements 13a and 13b are implemented by way of transistors 27a and 27b. Activation is accomplished directly from the output transistor of optical coupler 12, by way of base power resistor 28.

If the transmitted signal TxD in the device is "high" in the idle state (approx. +5 volts), the input diode of optical coupler 12 is activated by way of a current-limiting resistor 30. The through transistor of optical coupler 12 is consequently made conductive, and transistor 27*a* is blocked. A connection is thus created between signal 15 (RxD on the PC) and signal 17 (DTR) to which the PC assigns a value of approximately −12 volts. When the transmitted signal TxD in the device switches to "low" (approx. 0 volts), no current flows through the input diode of optical coupler 12, and the output transistor is blocked. In this case switching transistors 27*a* and 27*b* are activated by base power resistor 28 in such a way that transistor 27*a* opens and transistor 27*b* is blocked. A connection is thus created between signal 15 (RxD on the PC) and signal 14 (RTS) to which the PC assigns a value of approximately 12 volts.

Figure 4:
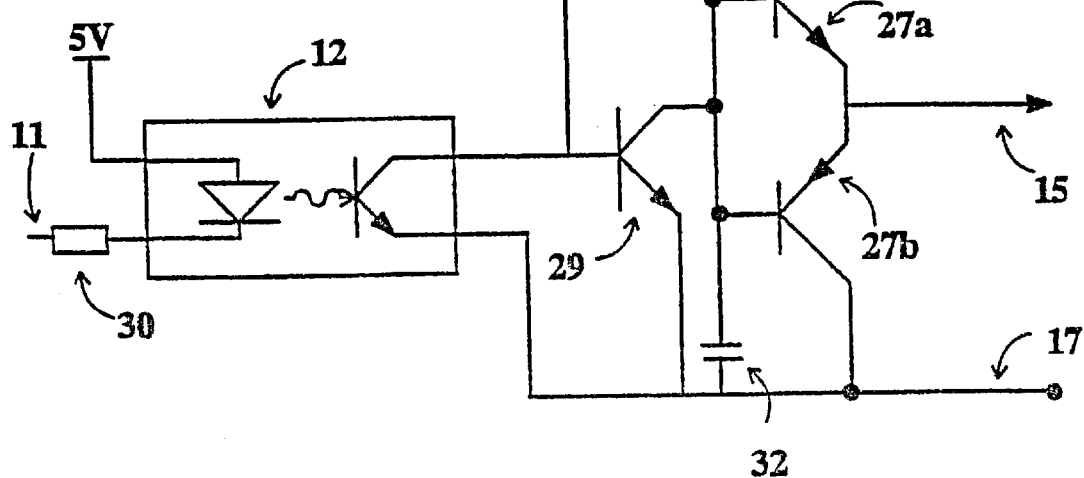
FIG. 4 shows a circuit for different optical coupler delay times.

The circuit as shown in FIG. 3 is suitable for low transmission speeds. In order to compensate for different optical coupler delay times when switching from "low" to "high" and vice versa, a circuit as shown in FIG. 4 can be used. In this, a transistor 29 with resistor 31 is added. The slow switching operation upon blocking of the optical coupler output transistor is accelerated by the fact that transistor 29 becomes conductive immediately when the collector-emitter voltage of the optical coupler output transistor reaches approximately 0 volts. In addition, a capacitor 32 can slow down the "fast" edge during charging through resistor 28. Because of the additional inversion of the signal by transistor 29, the polarity with which the input diode of optical coupler 12 is activated must be reversed.

Similar circuits for both transmission directions can also be implemented without optical couplers.

What is claimed is:

1. A converter for digital data transmission between an electrical interface of a first device and an electrical interface of a second device, the electrical interface of the second device configured as an RS-232 interface, the first device using a first high voltage level corresponding to a high logical state of the first device and a first low voltage level corresponding to a low logical state of the first device and the second device using a second high voltage level of approximately −12 volts corresponding to a high logical state of the second device and a second low voltage level of approximately +12 volts corresponding to a second low logical state of the second device, the first low voltage level having a lower absolute value than the second low voltage level and the first high voltage level having a lower absolute value than the second high voltage level, the converter comprising:

a circuit for converting the first high voltage level to the second high voltage level and the first low voltage level to the second low voltage level wherein the circuit uses the second high voltage level and second low voltage level for the converting, the second low voltage is conveyed to the circuit over first data line of the circuit via a Request To Send output of the second device interface and the second high voltage level is conveyed to the circuit over a second data line via a Data Terminal Ready output of the second device interface, and wherein the circuit includes a switching member controllable by the logical state of the first device for connecting one of the first data line and the second data line with a data input line of the second device interface.

2. The converter as recited in claim 1 wherein the first high voltage level is approximately 0 volts and the first low voltage level is approximately +5 volts.

3. The converter as recited in claim 1 further comprising a coupling piece including a housing for housing the circuit, the coupling piece capable of plugging into the electrical interface of at least one of the first and second devices.

4. The converter as recited in claim 3 wherein the coupling piece further includes a data transmission cable connecting the coupling device to one of the electrical interface of the first device and the electrical interface of the second device.

5. The converter as recited in claim 2 wherein the circuit is housed in one of the first and second devices.

6. The converter as recited in claim 2 wherein the switching member includes a first and second input and an output, wherein the first input connected to the first data line, the second input connected to the second data line and the output connected to the data input line of the electrical interface of the second device.

7. The converter as recited in claim 2 wherein the circuit includes a coupling member for providing a galvanic separation of the first and second devices.

8. A converter for digital data transmission between an electrical interface of a first device and an electrical interface of a second device, the electrical interface of the second device configured as an RS-232 interface, the first device using a first high voltage level corresponding to a high logical state of the first device and a first low voltage level corresponding to a low logical state of the first device and the second device using a second high voltage level of approximately −12 volts corresponding to a high logical state of the second device and a second low voltage level of approximately +12 volts corresponding to a second low logical state of the second device, the first low voltage level having a lower absolute value than the second low voltage level and the first high voltage level having a lower absolute value than the second high voltage level, the converter comprising:

a circuit for converting the first high voltage level to the second high voltage level and the first low voltage level to the second low voltage level wherein the circuit uses the second high voltage level and second low voltage level for the converting, the second low voltage is conveyed to the circuit over first data line of the circuit via a Request To Send output of the second device interface and the second high voltage level is conveyed to the circuit over a second data line via a Data Terminal Ready output of the second device interface, and wherein the circuit includes a switching member controllable by the logical state of the first device for connecting one of the first data line and the second data line with a data input line of the second device interface;

wherein the first high voltage level is approximately 0 volts and the first low voltage level is approximately +5 volts;

wherein the circuit includes a coupling member for providing a galvanic separation of the first and second devices; and wherein the coupling member is an optical coupler.

9. The converter as recited in claim 2 wherein the circuit includes a transformation element for lowering an input voltage of approximately +12 volts to approximately 0 volts.

10. The converter as recited in claim 9 wherein the circuit further includes a blocking member for converting an input voltage of approximately −12 volts to approximately +5 volts.

11. The converter as recited in claim 10 wherein the blocking member is a diode.

12. The converter as recited in claim 2 wherein the second device is a computing system and the first device is a stored-program control system including a system housing, the system housing containing a calculation unit, a display, a control unit, signal inputs, an electrical interface, and signal outputs.

13. The converter as recited in claim 12 wherein the calculation unit includes a microcontroller.

14. A converter for digital data transmission between an electrical interface of a first device and an electrical interface of a second device, the electrical interface of the second device configured as an RS-232 interface, the first device using a first high voltage level corresponding to a high logical state of the first device and a first low voltage level corresponding to a low logical state of the first device and the second device using a second high voltage level of approximately −12 volts corresponding to a high logical state of the second device and a second low voltage level of approximately +12 volts corresponding to a second low logical state of the second device, the first low voltage level having a lower absolute value than the second low voltage level and the first high voltage level having a lower absolute value than the second high voltage level, the converter comprising:

a circuit for converting the first high voltage level to the second high voltage level and the first low voltage level to the second low voltage level wherein the circuit uses the second high voltage level and second low voltage level for the converting, the second low voltage is conveyed to the circuit over first data line of the circuit via a Request To Send output of the second device interface and the second high voltage level is conveyed to the circuit over a second data line via a Data Terminal Ready output of the second device interface, and wherein the circuit includes a switching member controllable by the logical state of the first device for connecting one of the first data line and the second data line with a data input line of the second device interface;

wherein the circuit includes a coupling member for providing a galvanic separation of the first and second devices; and wherein the coupling member is an optical coupler.

15. A converter for digital data transmission, comprising:

a circuit for converting a first high voltage level of a first device to a second high voltage level of a second device and a first low voltage level of the first device to a second low voltage level of the second device, the circuit using the second high voltage level and the second low voltage level for the converting;

a first arrangement adapted to receive a second low voltage for the circuit, the second low voltage being conveyed to the circuit via a Request To Send output of a second device interface over a first data line, the second low voltage level being approximately +12 volts and corresponding to a second low logical state of the second device;

a second arrangement adapted to receive a second high voltage, the second high voltage being conveyed to the circuit via a Data Terminal Ready output of the second device interface over a second data line, the second high voltage level being approximately −12 volts and corresponding to a second high logical state of the second device; and a switching member controllable by a logical state of the first device for connecting one of the first data line and the second data line with a data input line of the second device interface.

* * * * *